US012708024B2

(12) United States Patent
Liu et al.

(10) Patent No.: US 12,708,024 B2
(45) Date of Patent: Aug. 11, 2026

(54) PACKAGE WITH MOLDING CAVITY

(71) Applicant: SEMICONDUCTOR COMPONENTS INDUSTRIES, LLC, Scottsdale, AZ (US)

(72) Inventors: Yong Liu, Cumberland Foreside, ME (US); Liangbiao Chen, Scarborough, ME (US); Chee Hiong Chew, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 422 days.

(21) Appl. No.: 18/311,100

(22) Filed: May 2, 2023

(65) Prior Publication Data

US 2024/0371659 A1 Nov. 7, 2024

(51) Int. Cl.

*H10W 74/01* (2026.01)
*H10P 95/90* (2026.01)
*H10W 40/25* (2026.01)
*H10W 70/40* (2026.01)
*H10W 74/00* (2026.01)

(Continued)

(52) U.S. Cl.

CPC .......... *H10W 74/016* (2026.01); *H10P 95/90* (2026.01); *H10W 40/255* (2026.01); *H10W 70/468* (2026.01); *H10W 74/012* (2026.01); *H10W 74/15* (2026.01); *H10W 74/00* (2026.01); *H10W 90/751* (2026.01); *H10W 90/763* (2026.01)

(58) Field of Classification Search

None

See application file for complete search history.

(56) References Cited

U.S. PATENT DOCUMENTS 9,275,926 B2 3/2016 Hable et al.
9,390,996 B2 7/2016 Jeon (Continued)

FOREIGN PATENT DOCUMENTS

CN 113161311 A 7/2021
GB 2565071 A 2/2019

OTHER PUBLICATIONS

International Search Report and Written Opinion for PCT Application No. PCT/US2024/027146 mailed on Sep. 25, 2024, 17 pages.

(Continued)

*Primary Examiner* — Brent A. Fairbanks
*Assistant Examiner* — Derek L Nielsen
(74) *Attorney, Agent, or Firm* — Brake Hughes Bellermann LLP

(57) ABSTRACT

A high-power semiconductor device module is implemented with a cavity in the molding package. The cavity reduces a volume of the molding compound, preventing an accumulation of stress in the module, and associated warpage of the package. Chip assemblies within the module are designed to fit within the cavity, so that semiconductor dies, and sensing devices therein are protected from damage during a sintering process in which the module is mounted to a heat sink. After the sintering process, the cavity can be sealed with a gel material. The molding package described herein can also enhance reliability of the module during operation, ensuring that the product is robust for electric and hybrid electric vehicle applications.

20 Claims, 11 Drawing Sheets

(51) Int. Cl.
*H10W 74/15* (2026.01)
*H10W 90/00* (2026.01)

(56) References Cited

U.S. PATENT DOCUMENTS

| | | | | |
|---|---|---|---|---|
| 2011/0122583 | A1 | 5/2011 | Lowry | |
| 2013/0161801 | A1* | 6/2013 | Otremba | H01L 23/49562 361/813 |
| 2014/0151868 | A1 | 6/2014 | Bayerer | |
| 2017/0320725 | A1* | 11/2017 | Goida | B81B 7/0051 |
| 2019/0006260 | A1* | 1/2019 | Pavier | H10W 40/255 |
| 2019/0198355 | A1* | 6/2019 | Basler | H10W 74/016 |
| 2020/0283286 | A1* | 9/2020 | Meinhold | B81B 3/0072 |

OTHER PUBLICATIONS

SystemPlus Consulting, “Double Side Cooled 700 V 400A IGBT Module,” Infineon FF400R07A01E3, Tech report, 2018, 40 pages.

* cited by examiner

PACKAGE WITH MOLDING CAVITY

TECHNICAL FIELD

This description relates to assembling and packaging semiconductor device modules, e.g., semiconductor device assemblies, semiconductor device module assemblies, etc. More specifically, this description relates to implementations of high power semiconductor device assemblies and modules with improved thermal performance and reduced mechanical stress.

BACKGROUND

Semiconductor device modules, such as modules including power semiconductor devices, can be implemented using multiple semiconductor dies, multiple substrates (e.g., direct-bonded metal (DBM) substrates, die attach pads (DAPs)), electrical interconnections, and a molding compound. Power transistors can include, for example, insulated-gate bipolar transistors (IGBTs) and power metal-oxide-semiconductor field effect transistors (MOSFETs). Electrical interconnections within a high-power semiconductor device module can include, for example, bond wires, conductive spacers, and conductive clips. A polymer molding compound can serve as an encapsulant to protect components of the device assembly. Such power transistor devices can be used in various applications, including automotive and/or industrial applications.

SUMMARY

In some aspects, the techniques described herein relate to an apparatus, including: a substrate; a chip assembly coupled to the substrate, the chip assembly including a semiconductor die; a molding package formed around the chip assembly and the substrate, the molding package having a cavity including a gel material; a mounting bracket attached to the substrate; and a lead that provides a signal path from an external device to the semiconductor die.

In some aspects, the techniques described herein relate to an apparatus, wherein the semiconductor die includes a power inverter circuit.

In some aspects, the techniques described herein relate to an apparatus, wherein the power inverter circuit is configured for use in one or more of an electric vehicle and a hybrid electric vehicle.

In some aspects, the techniques described herein relate to an apparatus, wherein the gel material includes one or more of JCR6101 and HD-8820.

In some aspects, the techniques described herein relate to an apparatus, further including a sense pad attached to the substrate, the sense pad configured to sense pressure applied to the molding package.

In some aspects, the techniques described herein relate to an apparatus, wherein the sense pad is wire bonded between the semiconductor die and the lead.

In some aspects, the techniques described herein relate to an apparatus, further including a clip within the cavity, the clip providing connections to the semiconductor die.

In some aspects, the techniques described herein relate to an apparatus, including: a substrate; a power inverter circuit coupled to the substrate; and a molding package formed around the power inverter circuit and the substrate, the molding package having a cavity formed therein.

In some aspects, the techniques described herein relate to an apparatus, wherein the cavity is filled with a gel material.

In some aspects, the techniques described herein relate to an apparatus, wherein the power inverter circuit is in a flip chip configuration.

In some aspects, the techniques described herein relate to an apparatus, wherein the cavity has a volume that is about 15% of a volume of the molding package.

In some aspects, the techniques described herein relate to an apparatus, further including a direct-bonded metal (DBM) structure that provides single sided cooling for the power inverter circuit.

In some aspects, the techniques described herein relate to an apparatus, wherein the package exhibits warpage less than about 30 μm.

In some aspects, the techniques described herein relate to a method, including: attaching a chip assembly, including a semiconductor die, to a substrate; attaching a clip between the chip assembly and the substrate; attaching a wire bond between the chip assembly and a sense pad on the substrate; forming a molded package around the substrate to form a module, the molded package including a cavity that exposes the chip assembly, the clip, and at least a portion of the sense pad; sintering the module to a base; and disposing a gel material in the cavity.

In some aspects, the techniques described herein relate to a method, wherein sintering the module to the base subjects the semiconductor die to a tensile stress of more than about 200 MPa.

In some aspects, the techniques described herein relate to a method, wherein including the cavity in the molded package reduces a stress on the semiconductor die by more than about 60% during sintering.

In some aspects, the techniques described herein relate to a method, wherein including the cavity in the molded package reduces warpage of the molded package by more than about 15% during sintering at a temperature of about 25 degrees C.

In some aspects, the techniques described herein relate to a method, wherein including the cavity in the molded package reduces warpage of the molded package by more than about 45% during sintering at a temperature of about 220 degrees C.

In some aspects, the techniques described herein relate to a method, wherein forming the molded package around the substrate includes forming the molded package by injection molding of an epoxy molding compound.

In some aspects, the techniques described herein relate to a method, wherein sintering the molded package to the base includes sintering the molded package to a heat sink.

Figure 1:
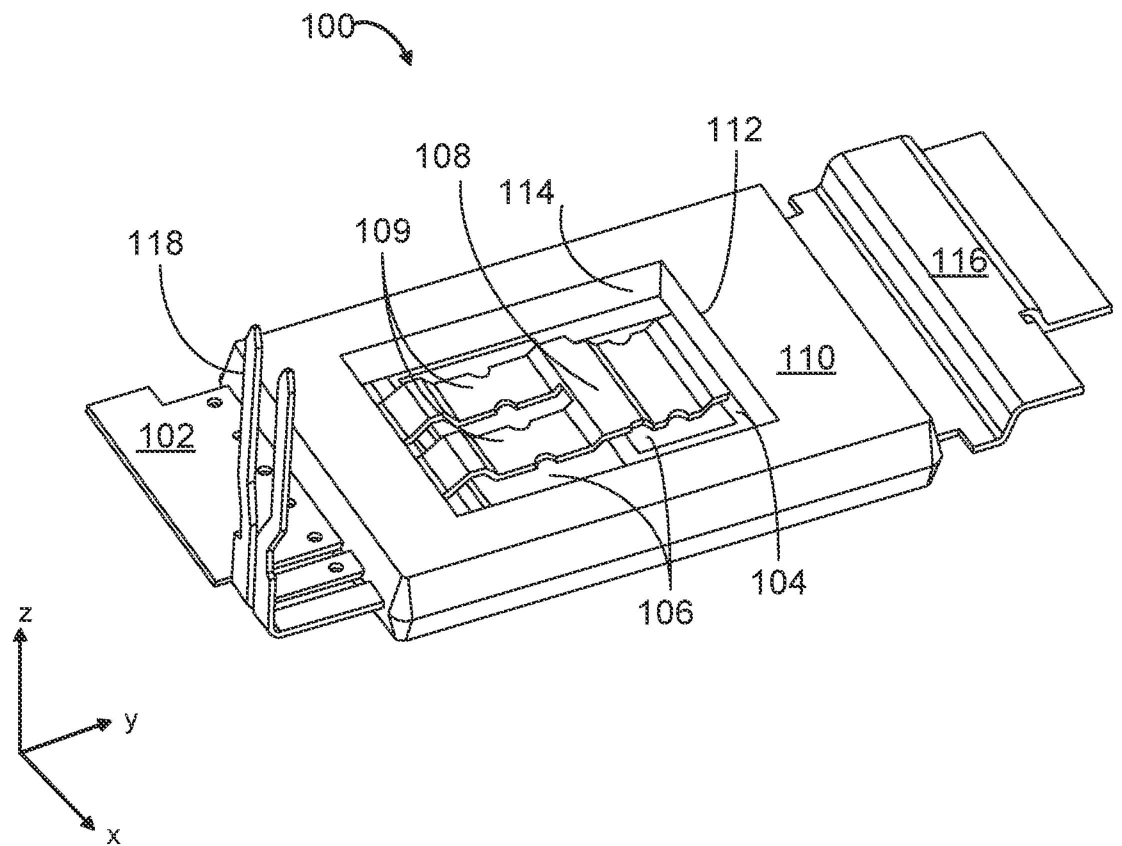
FIG. 1 is an exterior view of a high-power semiconductor device module configured with a gel-filled molding cavity, according to an implementation of the present disclosure.

Aspects of the present disclosure are best understood from the following detailed description when read with the accompanying figures. It is noted that, in accordance with common practice in the industry, various features are not necessarily drawn to scale. Dimensions of the various features may be arbitrarily increased or reduced for clarity of discussion. In the drawings, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

In an assembly process for a high power semiconductor device module, a semiconductor die assembly, e.g., a chip assembly, including one or more semiconductor dies containing electronic devices, is first attached to a substrate. The chip assembly may include, for example, an insulated gate bipolar transistor (IGBT) die in combination with a fast recovery diode (FRD) die. Contact or bond pads of the semiconductor dies can then be attached by wire bonding to contact pads at ends of the leads of a lead frame. After attaching the semiconductor die assembly, the lead frame is placed in a mold. The molding is provided with a reservoir for containing a quantity of an insulating molding compound. The molding compound is then injected into the mold to encapsulate the die attach pad(s) and the semiconductor die(s). The resulting encapsulated unit, or module, can then be attached to a metal heat sink that provides a large thermal mass to absorb heat for dissipation through a fin structure.

Current implementations of the assembly process for such high power semiconductors can have certain drawbacks that can result in damage to the module. For example, if a large volume of molding compound is used in packaging the module, the molding compound can transfer excess stress to top surfaces of the semiconductor die(s) during a subsequent sintering process that attaches the module to the heat sink. High temperatures and pressures used during the sintering process can thus result in cracks or fractures in a passivation layer at corners of the die(s), which can damage internal electronic components of the assembly. Such damage may result in premature failure of devices within the chip assembly, poor thermal performance, or poor reliability.

In addition to the assembly process, die cracks can also occur during reliability testing or during operation of the high power semiconductor device module. For example, when copper components are used as heat sinks to dissipate heat generated by a high power chip assembly, or die assembly, rapid expansion of the copper can induce tensile stress in adjacent materials. As power levels, power density, and associated operating frequencies and temperatures for such devices increase, incidents of such damage can occur more frequently. Some implementations may only allow for cooling of the assembly, e.g., by attaching a thermal dissipation appliance, on a single side of the assembly. Such thermal imbalances can cause and/or exacerbate stresses between components within such an assembly. Failures can occur during high temperature operation, high frequency operation, or when the module undergoes reliability testing involving temperature cycling.

In some applications, the power transistor devices within the module can be used to implement electronic circuits, e.g., inverters or power amplifiers, used in automotive systems such as electrical vehicles (EVs) and/or hybrid electrical vehicles (HEVs). Such applications cannot tolerate die cracks.

This disclosure relates to implementations of high-power semiconductor device assemblies and modules with improved thermal performance and reduced mechanical stresses that address the issues described above. One solution is to introduce a protective element to relieve stress on the die top, and on an adjacent passivation layer of the die, during the package sintering process, and during operation of the module. A type of protective element presented herein is a cavity formed in the molding package. Following the sintering process, the cavity can be filled with a gel material. The gel-filled cavity replaces a bulk volume of the molding compound with a more flexible material. An associated reduction in the volume of the molding compound also reduces warpage of the module during sintering. A novel clip design and a specialized direct bonded metal (DBM) (e.g., direct bonded copper (DBC)) pattern are implemented to ensure that the chip assemblies being protected are disposed within the molding cavity. The solutions described herein also enhance reliability of the module, improving reliability test results and ensuring that the product is robust for EV and HEV applications.

FIG. 1 shows an exterior view of an example of a high-power semiconductor device module 100 attached to a lead frame 102, according to some implementations of the present disclosure. An interior view of the high-power semiconductor device module 100 is provided below in FIG. 2. In some implementations, the high-power semiconductor device module 100 includes, as fundamental elements, a substrate 104, one or more chip assemblies 106 (two shown), and a clip 108 within a molded package 110. In some implementations, the substrate 104 can be a body portion of the lead frame 102.

The chip assemblies 106 can include a transistor chip assembly, e.g., including an IGBT die, and a diode chip assembly, e.g., including an FRD die, attached to the substrate 104. The IGBT die, together with the FRD die, may form a power inverter. In some implementations, the transistor chip assembly is larger than the diode chip assembly.

The clip 108 provides mechanical and electrical connections to terminals of the diode and transistor devices. The clip 108 also serves to dissipate heat from the chip assemblies 106. In some implementations, the clip 108 can be made of copper or another conductive material. In some implementations, the clip 108 can include prongs 109 (two shown) separated by a break. The prongs 109 can provide separate connections to different terminals of a device within the IGBT chip assembly 106.

The molded package 110 surrounds a molding cavity 112 filled with a gel material 114. The molded package 110 can be made of, for example, an epoxy molding compound (EMC). In some implementations, the molded package 110 can have a length in a range of about 24 mm to about 30 mm and a width in a range of about 15 mm to about 19 mm. The molding cavity 112 can be in a range of about 10 mm to about 14 mm long and in a range of about 5.0 mm to about 7.0 mm wide. The molding cavity 112 thus occupies about 14% to about 18% of the overall volume of the molded package 110.

Outside the molded package 110, the high-power semiconductor device module 100 further includes a mounting bracket 116 and leads 118. The leads 118 (two shown) provide signal paths between semiconductor dies within the chip assemblies 106 and external devices, power supplies, and ground connections. In some implementations, the lead frame 102, clip 108, mounting bracket 116, and leads 118 can be cut or stamped from a thin, rolled sheet of metal, e.g., copper. The mounting bracket 116 can be used to mount the high-power semiconductor device module 100 to a heat sink (not shown).

Figure 2:
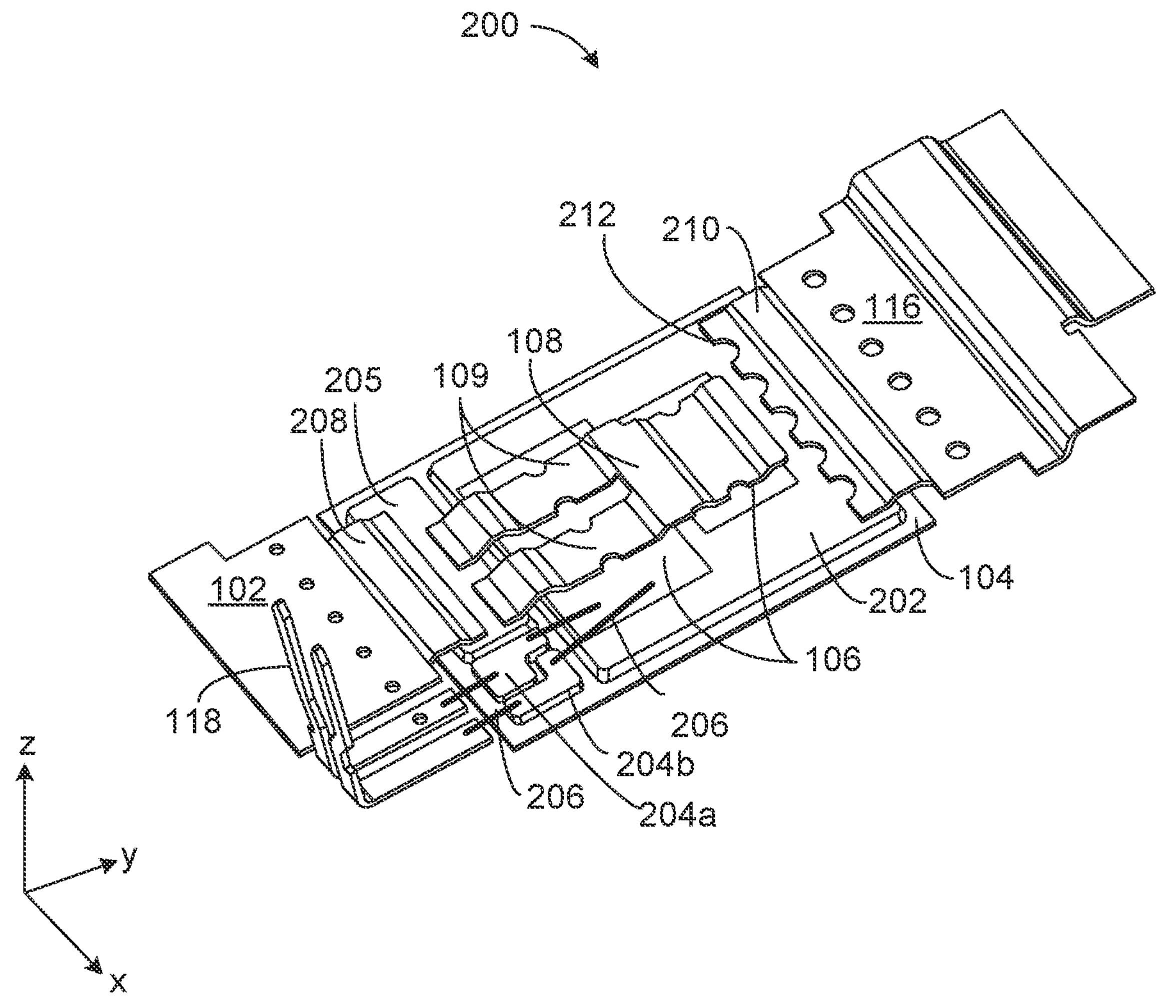
FIG. 2 is an interior view of a high-power semiconductor device module configured with a molding cavity, according to an implementation of the present disclosure.

FIG. 2 shows an interior view of elements 200 within the high-power semiconductor device module 100, according to some implementations of the present disclosure. In FIG. 2, the high-power semiconductor device module 100 is shown without the molded package 110. Elements 200 include additional components such as a die attach pad (DAP) in the form of a direct bonded metal (DBM) structure 202, sense pads 204 (two shown, 204*a* and 204*b*), a landing pad 205, wire bonds 206 (four shown), a lead frame pin 208, and a mounting bracket pin 210.

The DBM structure 202 is disposed under the chip assemblies 106, on the substrate 104. In some implementations, the DBM structure 202 is a direct bonded copper (DBC) type structure, or a direct bonded aluminum (DBA) or direct plating copper (DPC) type structure. The DBM structure 202 can be designed as a three-layer structure that includes a large thermal mass, e.g., a dielectric, disposed between two outer metal layers to draw in and absorb heat. In some implementations, the internal thermal mass within the DBM structure 202 can also provide electrical insulation. In some implementations, the DBM structure 202 provides single-sided cooling for the high-power semiconductor device module 100.

In some implementations, the chip assemblies 106 can be mounted in a flip chip configuration on top of the DBM structure 202 so that top layers of the semiconductor dies are facing the DBM structure 202. In a flip chip configuration, the clip 108 and the wire bonds 206 are not needed. The DMB structure can be modified to achieve the flip chip configuration. Top layers of the semiconductor dies may include, e.g., a passivation layer covering one or more layers of metallization of the integrated circuit device(s) therein. The passivation layer can be made of an insulating material such as polyimide. The landing pad 205 can provide mechanical stability for the prongs 109 of the clip 108, as well as an attachment point for the lead frame pin 208.

The sense pads 204 are disposed on the substrate 104 next to the DBM structure 202. In some implementations, the sense pads 204 are L-shaped and are interposed (e.g., interlocked, interleaved) so that their collective area fits into a substantially rectangular footprint. In some implementations, one of the sense pads 204*a* can be wider than the other sense pad 204*b*, to substantially fill an area (e.g., a central area) of the rectangular footprint. In some implementations, the sense pad 204*a* can be L-shaped while the sense pad 204*b* can be oriented as an upside down L-shape. In some implementations, the sense pads 204 can include micro-electromechanical devices, e.g., sense metals, capable of sensing environmental factors such as, for example, temperature and pressure. In some implementations, the sense pads 204 can be equipped with electrical sensors that are capable of sensing characteristics of the chip assemblies 106.

The wire bonds 206 provide electrical connections between the sense pads 204 and the IGBT chip assembly 106, and between the sense pads 204 and the leads 118. Each of the sense pads 204*a* and 204*b* is therefore coupled between a lead 118 and the IGBT chip assembly 116.

The lead frame pin 208 provides mechanical coupling between the substrate 104 and the lead frame 102. The mounting bracket pin 210 provides mechanical coupling between the substrate 104 and the mounting bracket 116, via the DBM 202. In some implementations, the mounting bracket pin 210 can be shaped to include a bend, to permit the mounting bracket 116 to be substantially co-planar with the substrate 104. Likewise, the lead frame pin 208 can include a bend to permit the lead frame 102 to be substantially co-planar with the substrate 104. The mounting bracket pin 210 and the lead frame pin 208 can both be nearly as wide as the support structures to which they are attached, to provide stable connections. In some implementations, the mounting bracket pin 210 and/or the lead frame pin 208 can have a serrated (e.g., wavy, scalloped) edge 212.

Figure 3:
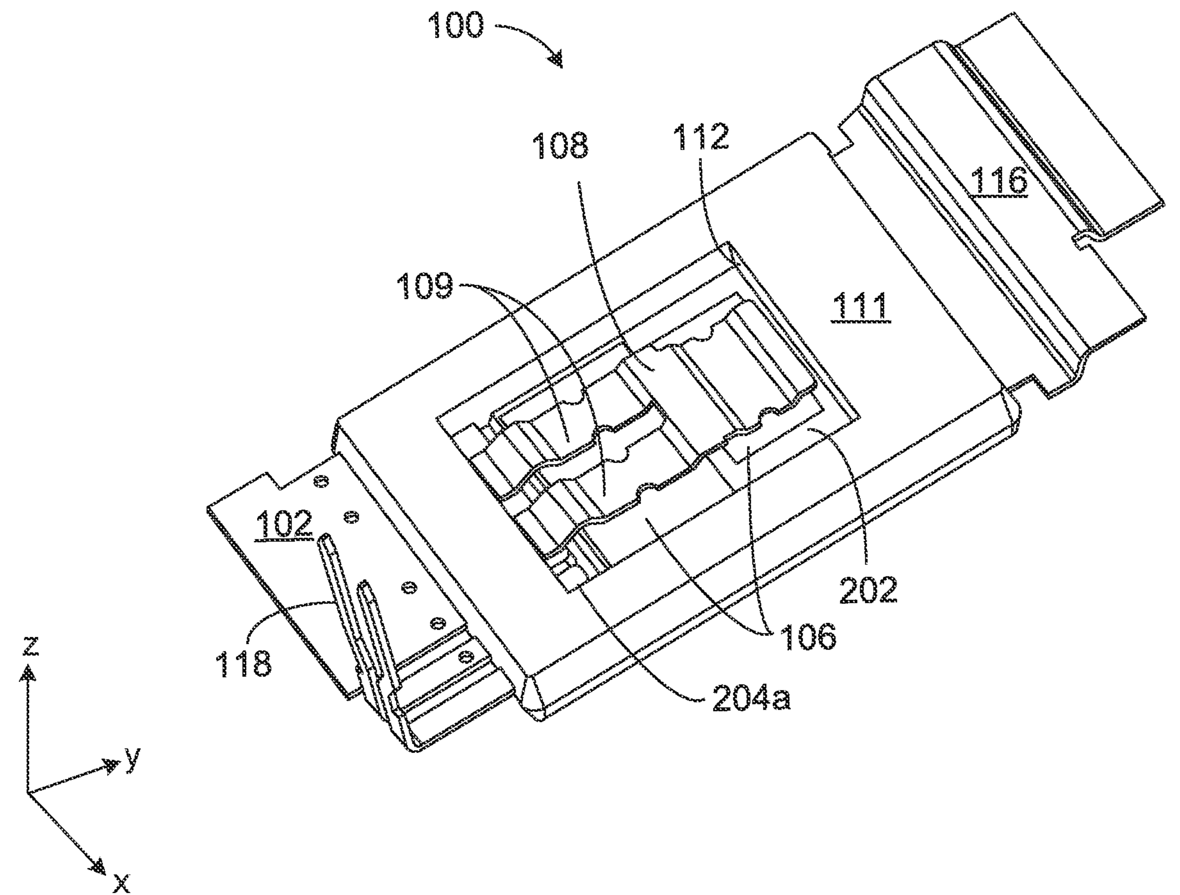
FIG. 3 is a perspective view of components within a molding cavity of a high-power semiconductor device module, according to an implementation of the present disclosure.

FIG. 3 shows a perspective view of the packaged high-power semiconductor device module 100, according to some implementations of the present disclosure. FIG. 3 is shown with the molded package 110 in place, but without the gel material 114 in the molding cavity 112. Comparing FIG. 3 with FIG. 2 shows the elements of the high-power semiconductor device module 100 that are covered by the molded package 110 and the elements of the high-power semiconductor device module 100 that are exposed within the molding cavity 112. For example, in some implementations, the sense pads 204, the lead frame pin 208 and the mounting bracket pin 210 are covered, or partially covered, by the molded package 110 while the chip assemblies 106 and the clip 108, including the prongs 109 separated by a break, are exposed (e.g., entirely exposed) within the opening of the molding cavity 112. In some implementations, one of the sense pads e.g., 204*a* can be at least partially exposed within the opening of the molding cavity 112, while the other sense pad, e.g., 204*b* is covered by the molded package 110. In some implementations, the sense pads 204 could be entirely exposed within the opening of the molding cavity 112. In some implementations, the chip assemblies 106, and the clip 108 are designed, arranged, and sized to fit within (e.g., entirely within) the open area of the molding cavity 112 without extending to the edges of the molding cavity 112. The DBM structure 202, however, is larger than the open area of the molding cavity 112. In some implementations, an outer perimeter of the DBM structure 202 extends under the molded package 110 and therefore is not exposed. In some implementations, the mounting bracket pin 210 (not shown in FIG. 3) is fully covered by the molded package 110, while a portion of the lead frame pin 208 is exposed within the molding cavity 112.

Figure 4:
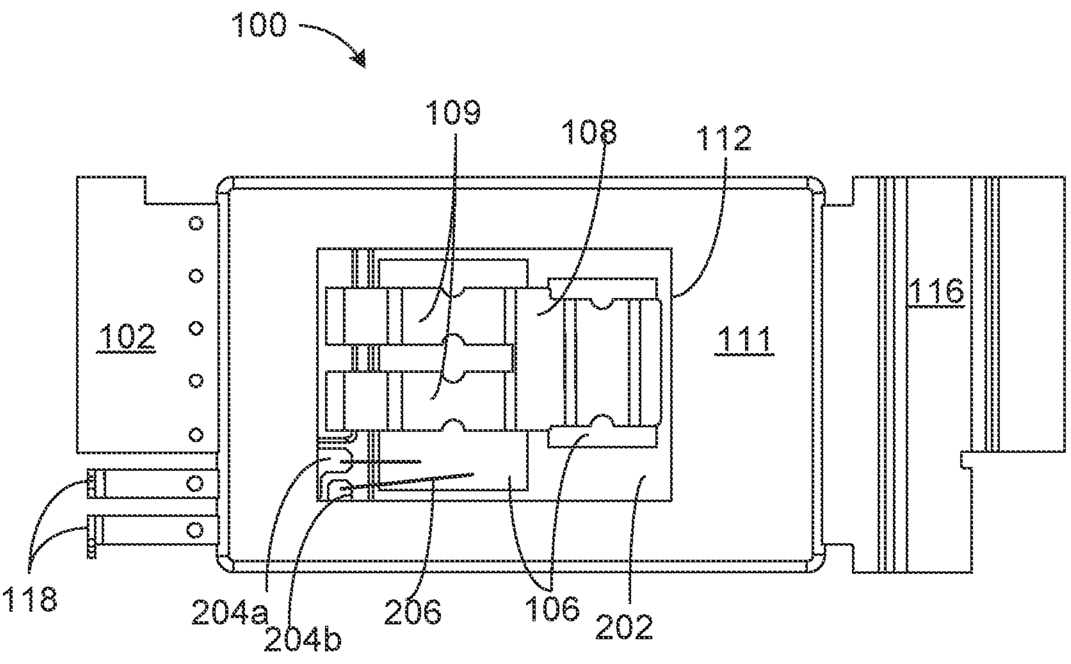
FIG. 4 is a top plan view of components within a molding cavity of a high-power semiconductor device module, according to an implementation of the present disclosure.
Figure 4:
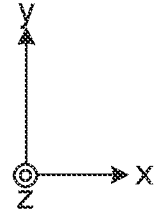

FIG. 4 shows a top plan view of the packaged high-power semiconductor device module 100, according to some implementations of the present disclosure. Like FIG. 3, FIG. 4 is shown with the molded package 110 in place, but without the gel material 114 in the molding cavity 112. FIG. 4 shows, more accurately than the perspective view of FIG. 3, which elements, or portions of elements, of the high-power semiconductor device module 100 are within the boundary of the molding cavity 112. In particular, FIG. 4 shows that, in addition to the chip assemblies 106 and the clip 108, at least portions of the sense pads 204 (e.g., L-shaped sense pads) and the wire bonds 206 connecting the sense pads 204 to the chip assemblies 106 are also within the boundary of the molding cavity 112. The sense pads 204 are therefore exposed to environmental conditions such as temperature and pressure so that such conditions can be sensed. When the molding cavity 112 is filled with the gel material 114, the gel material 114 can transmit both temperature and pressure from the outside environment to the sense pads 204. In some implementations, sensed temperature and pressure data can potentially be used in a feedback control capacity to reduce heat generation by the chip assemblies 106.

Figure 5:
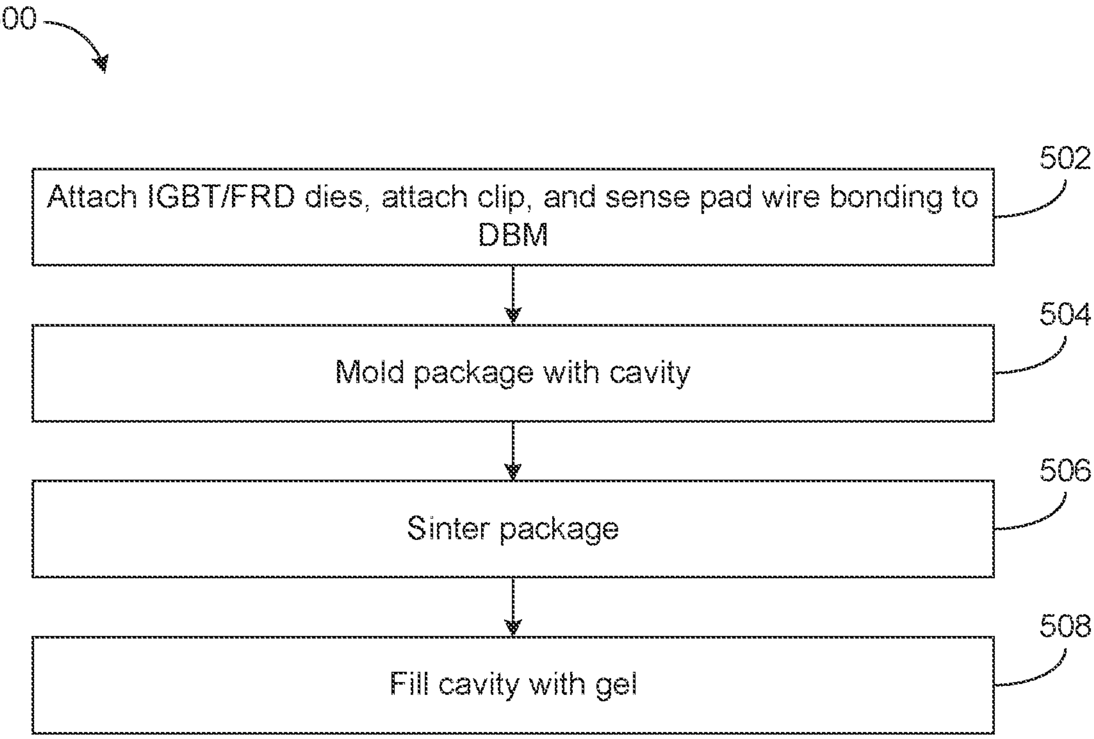
FIG. 5 is a flow diagram of a method for fabricating a high-power semiconductor device module configured with a gel-filled molding cavity, according to an implementation of the present disclosure.

FIG. 5 is a flow chart illustrating a method 500 for fabricating the high-power semiconductor device module 100, according to some implementations of the present disclosure. Operations of method 500 can be performed in a different order, or not performed, depending on specific applications. It is noted that method 500 may not produce a complete high-power semiconductor device module 100. Accordingly, it is understood that additional processes can be provided before, during, or after method 500, and that some of these additional processes may be briefly described herein. The operations 502-508 can be carried out to form high-power semiconductor device modules 100 having a gel-filled molding cavity, according to the implementations described above.

Figure 6:
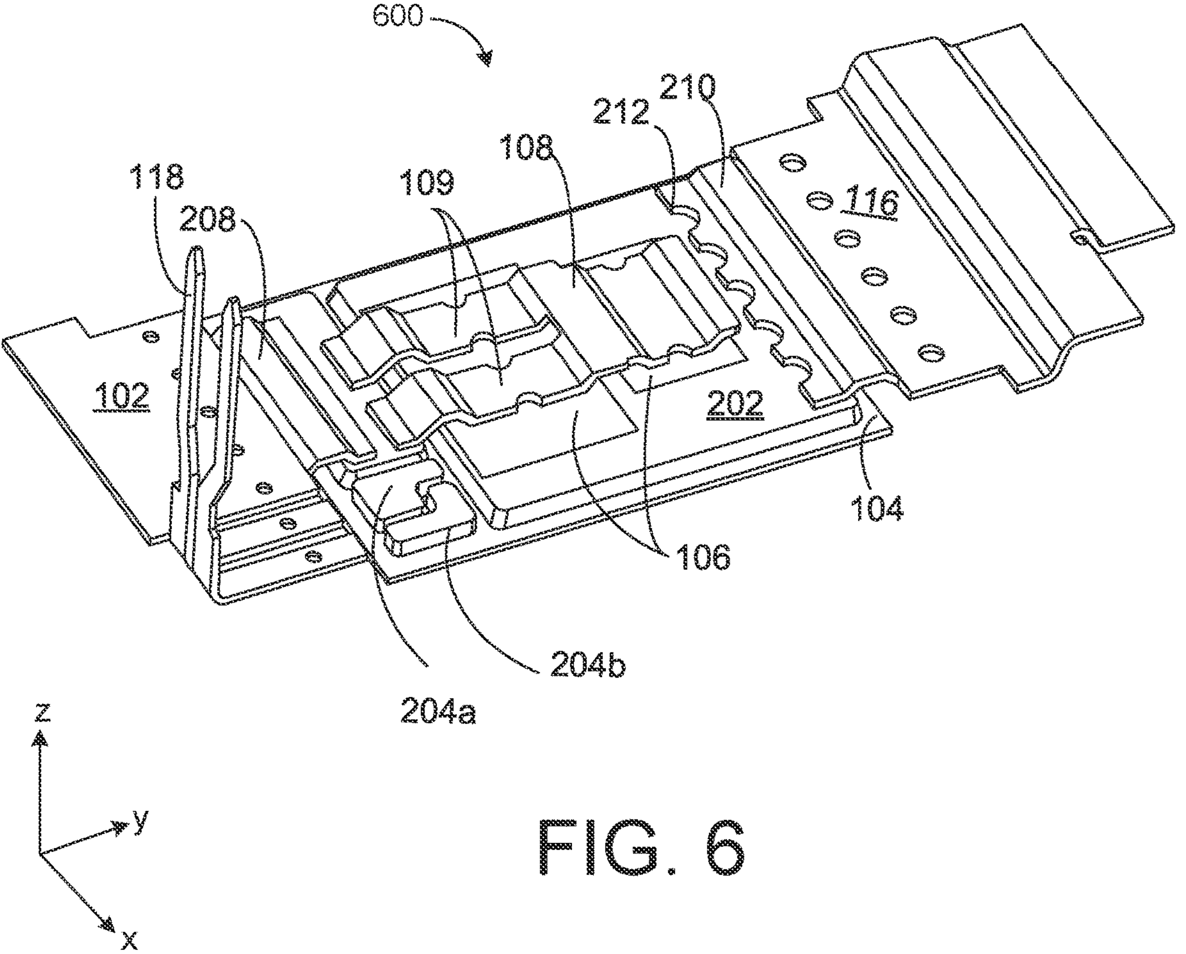
FIGS. 6-9 are perspective views of the high-power semiconductor device module at various stages of its fabrication process, according to an implementation of the present disclosure.

At 502, the method 500 includes attaching components and connectors to the DBM structure 202 as shown in FIG. 6, according to some implementations of the present disclosure. In some implementations, the chip assemblies 106 are first attached to the DBM structure 202 by mounting, or bonding, the dies to the DBM structure 202, e.g., using a bonding adhesive, e.g., a conductive bonding adhesive. In some implementations, the chip assemblies 106 can be coupled to the DBM structure 202 using e.g., a soldering reflow process, a sintering process, or other appropriate process. It is noted that the sense pads 204 are formed at the same time as the DBM structure 202, prior to carrying out operation 502.

The clip 108 can then be attached between the chip assemblies 106 and the lead frame pin 208, which extends underneath the molded package 110. The lead frame pin 208 can be attached to the lead frame 102, or the lead frame pin 208 can be integral to the lead frame 102. The mounting bracket pin 210 can be attached to the mounting bracket 116, or the mounting bracket pin 210 can be integral to the mounting bracket 116. Then, the wire bonds 206 can be installed between the chip assemblies 106 and the sense pads 204, and between the sense pads 204 and the leads 118.

Figure 7:
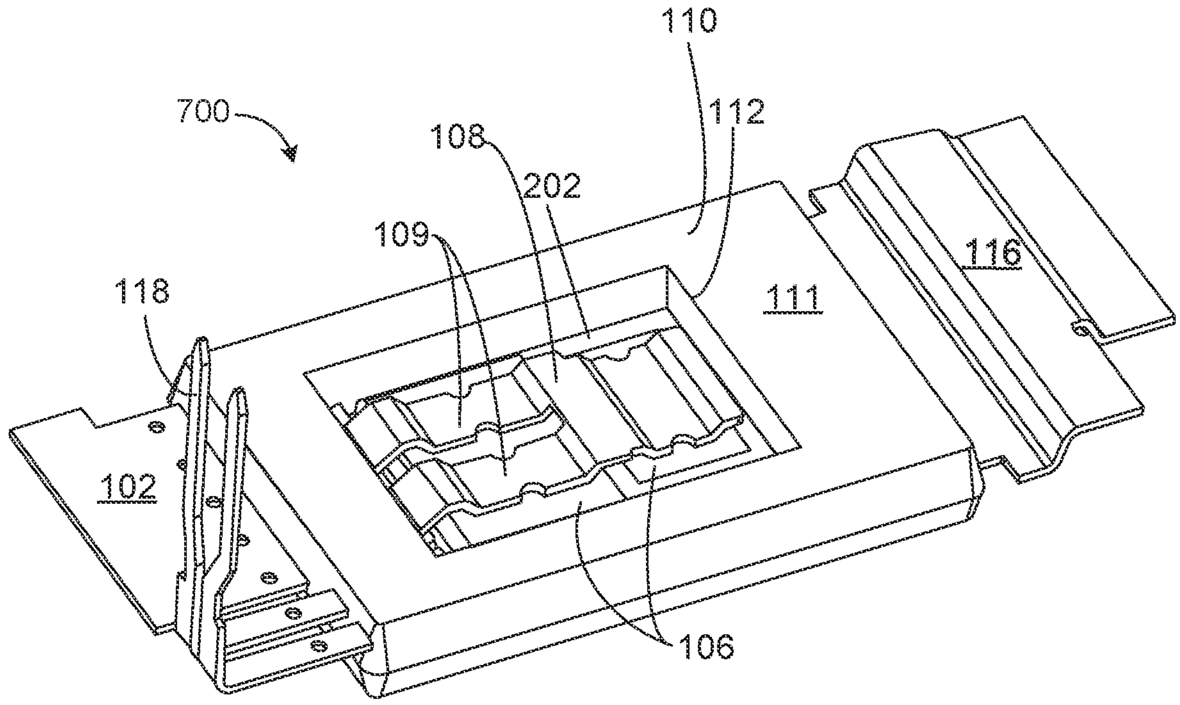
Figure 7:
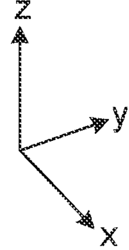

At 504, the method 500 includes forming the molded package 110 having the molding cavity 112, as shown in FIG. 7, according to some implementations of the present disclosure. In some implementations, the molded package 110 can be formed by injection molding. By using a customized injection molding tool that has an interior wall, the epoxy molding compound (EMC) can be prevented from spreading to a central region where the molding cavity 112 is to be formed.

Figure 8:
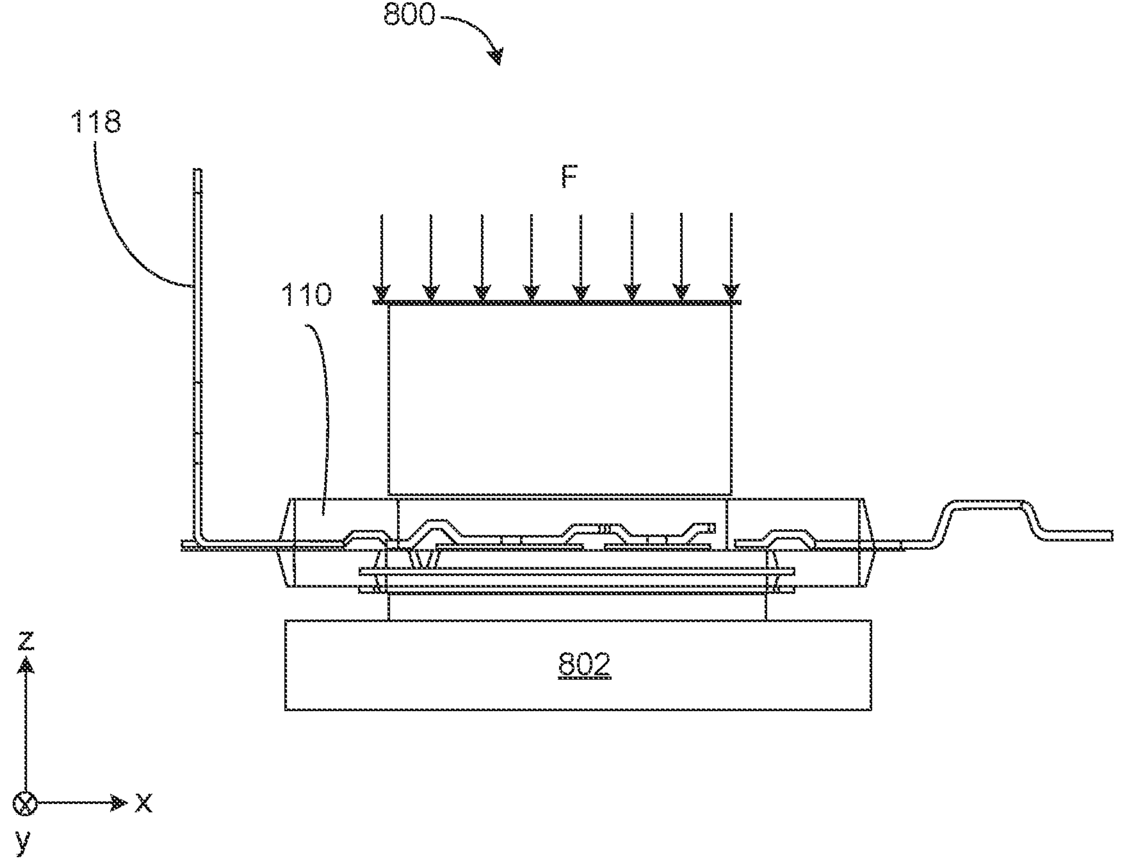

At 506, the method 500 includes sintering the molded package 110 as shown in FIG. 8, according to some implementations of the present disclosure. In some implementations, a silver sintering process 800 can be used at loading conditions involving high temperature and pressure, to attach the high power semiconductor device module 100 to a base 802, e.g., a heat sink. For example, a force F of about 2600 Newtons to about 3200 Newtons, causing pressure(s) in a range of about 18-22 mega Pascals (MPa), can be applied to the molded package 110 for a time interval in a range of about 180 seconds to about 220 seconds, at a temperature in a range of about 200 degrees C. to about 240 degrees C. During the sintering process, the presence of the molding cavity 112 can significantly reduce warpage of the molded package 110 so that less stress is imparted to the semiconductor dies in the chip assemblies 106. Because the volume of the molding compound is reduced, and because there is no molding compound directly above the chip assemblies 106, the effects of high heat and pressure on the semiconductor dies during the sintering process can be substantially ameliorated.

Figure 9:
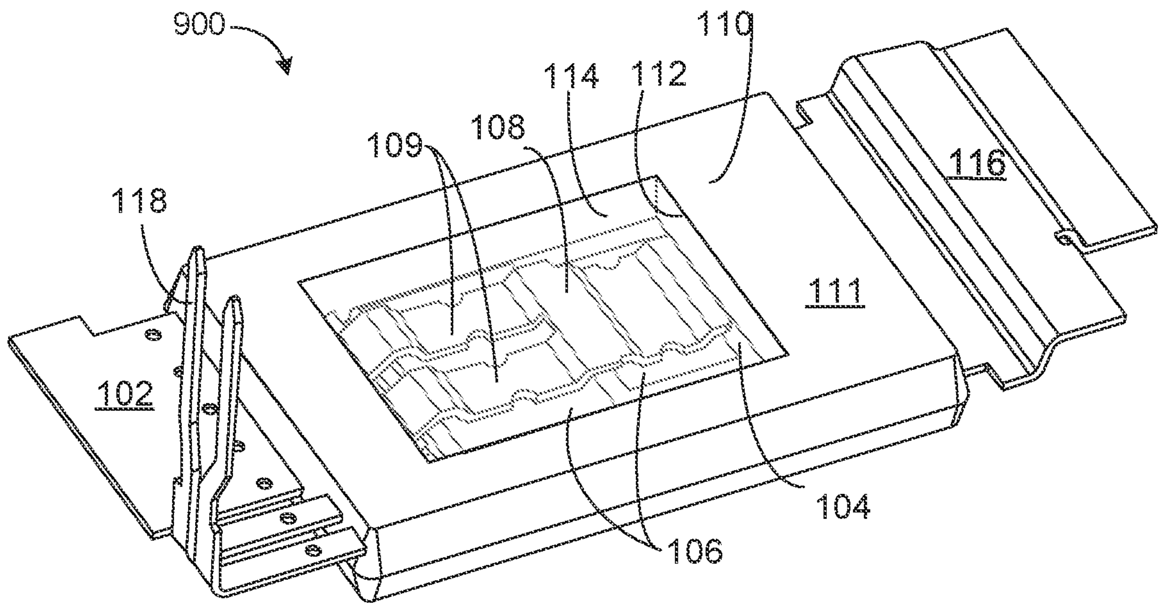
Figure 9:
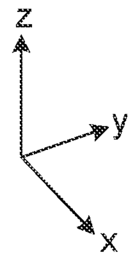

At 508, following the sintering process, the method 500 includes filling the molding cavity 112 with the gel material 114 as shown in FIG. 9, according to some implementations of the present disclosure. In some implementations, gel materials that are commercially available, such as JCR6101 or HD-8820, can be used to seal the exposed components within the molding cavity 112, e.g., the chip assemblies 106, the clip 108, the sense pads 204, and the wire bonds 206. The gel material 114 can be added to the molding cavity 112 until the volume reaches a top surface 111 of the molded package 110, so that the top surface 111 of the molded package 110 and the gel material 114 together define a planar surface. In some implementations, a top surface of the gel material 114 can be slightly lower or slightly higher than the top surface 111 of the molded package 110. In some implementations, the gel material 114 can be either partially or fully transparent so that components within the molding cavity 112 are exposed to ambient conditions while still being mechanically protected. In some implementations, an additional cover can be added over the gel-filled cavity for operation in hostile environments.

Figure 10A:
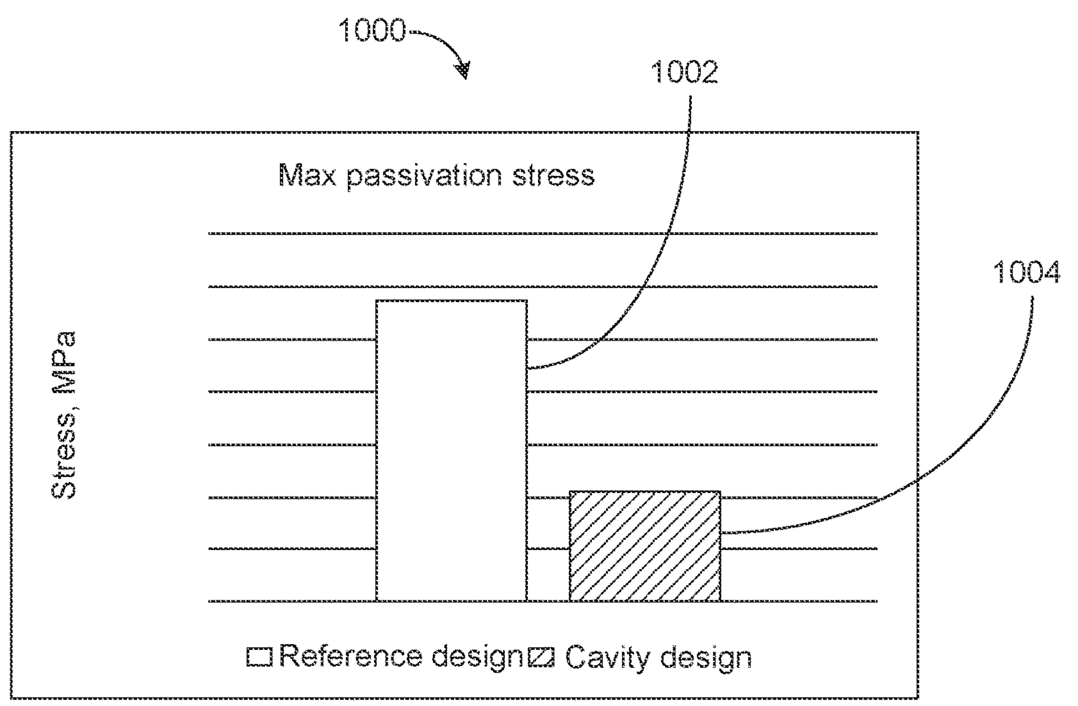
FIGS. 10A and 10B are plots of computer simulation data comparing stress on semiconductor dies within a high-power semiconductor device module for different molding package designs, according to an implementation of the present disclosure.

FIG. 10A shows a plot 1000 of computer simulation results for passivation stress reduction, according to some implementations of the present disclosure. The passivation stress reduction is observed when the molding cavity 112 filled with the gel material 114 is formed in the molded package 110 of the high-power semiconductor device module 100. The passivation stress represented in the plot in FIG. 10A is the maximum stress that would be experienced by the passivation layer of the chip assemblies 106 during the sintering process at operation 506.

Figure 10B:
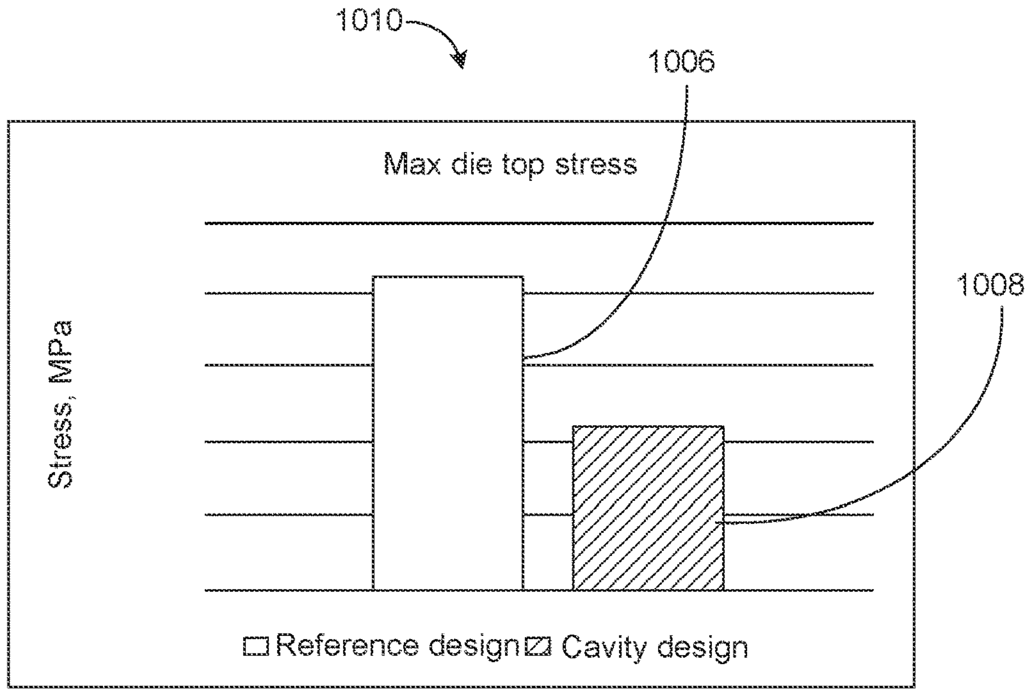

FIG. 10B shows a plot 1010 of computer simulation results for die top stress reduction, according to some implementations of the present disclosure. The die top stress reduction is observed when the molding cavity 112 is formed in the molded package 110 of the high-power semiconductor device module 100. The die top stress represented in the plot in FIG. 10B is the maximum stress that would be experienced at a top surface of the semiconductor die(s) within the chip assemblies 106 during a high temperature, high pressure sintering process at operation 506.

Computer simulations, e.g., simulations that use finite element analysis (FEA), were performed on a model of the high-power semiconductor device module 100, to evaluate calculated stresses on or near the tops of semiconductor dies in chip assemblies 106, when implemented with a protective element, e.g., the molding cavity 112. In some implementations, the semiconductor dies can be covered with a passivation layer that protects the underlying devices.

The simulation results are compared with results of a simulation modeling a high-power semiconductor device module 100 implemented without the molding cavity 112 ("Reference design"). Referring to FIG. 10A, a first data set 1002 is calculated as a representation of passivation stress, in units of mega Pascals (MPa) in the presence of a molded package 110 that does not have the molding cavity 112; a second data set 1004 is as a representation of passivation stress (MPa) in the presence of a molded package 110 that includes the empty molding cavity 112, prior to introducing the gel material 114. The improvement indicated by the simulation data plot in FIG. 10A shows a 63.5% decrease in passivation stress due to the molding cavity 112. Referring to FIG. 10B, a third data set 1006 is calculated as a representation of die top stress (MPa) in the presence of a molded package 110 that does not have the molding cavity 112; a fourth data set 1008 is as a representation of die top stress (MPa) in the presence of a molded package 110 that includes the molding cavity 112 filled with the gel material 114. The improvement indicated by the simulation data plot in FIG. 10B shows a 47.9% decrease in die top stress due to the molding cavity 112.

Figure 11:
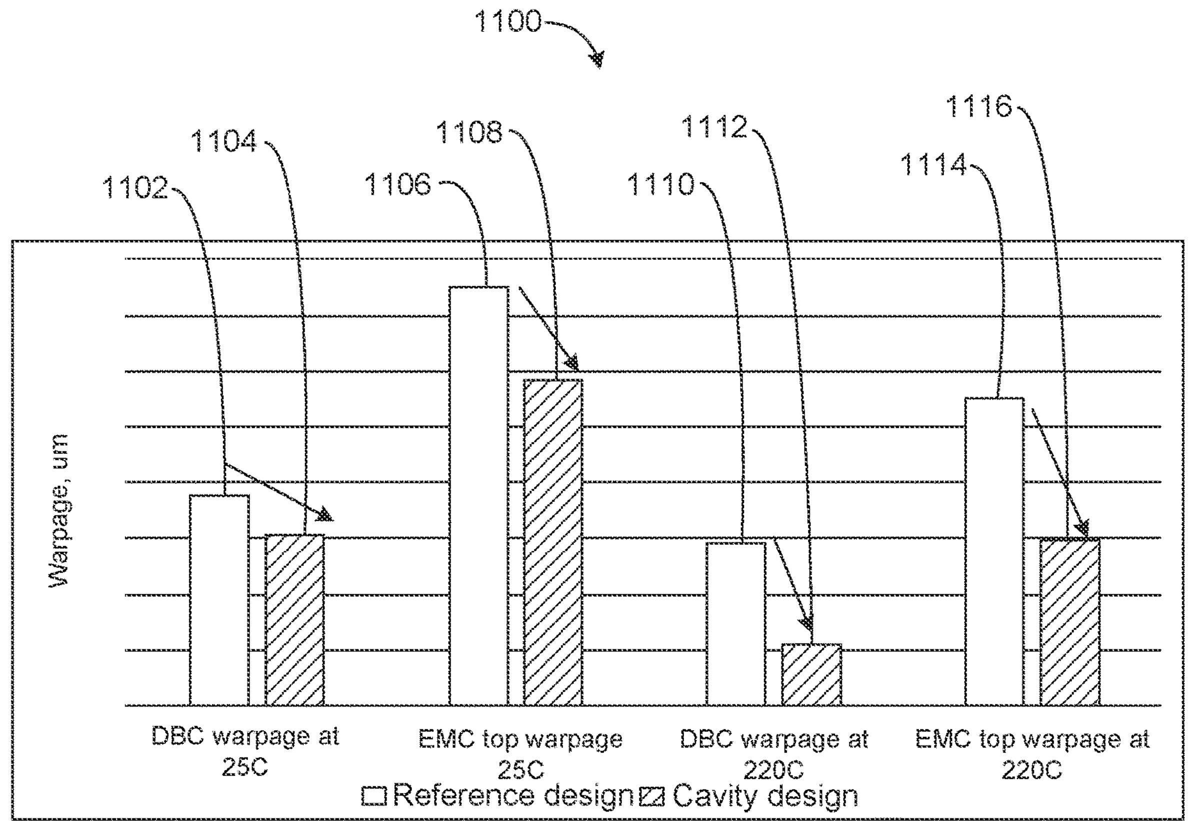
FIG. 11 is a plot of computer simulation data comparing warpage of different molding package designs, according to an implementation of the present disclosure.

FIG. 11 shows a plot 1100 of computer simulation results for warpage reduction, according to some implementations of the present disclosure. Measuring warpage of various structures that are part of the high-power semiconductor device module 100 can be an indicator of process-induced stress on materials within the high-power semiconductor device module 100. Consequently, modeling the warpage that occurs during, for example, the sintering process at different temperatures can provide guidance for selection of manufacturing process conditions.

A first data set 1102 is calculated as a representation of warpage of a copper implementation of the DBM structure 202, e.g., a DBC structure, in units of microns (μm) within a high-power semiconductor device module 100 that is not equipped with the molding cavity 112. The DBC warpage occurs during the sintering operation 506 at room temperature (25 degrees C.). A second data set 1104 is calculated as a representation of DBC warpage within a high-power semiconductor device module 100 that is equipped with the molding cavity 112. Improvement indicated by the first simulation data plot in FIG. 11 shows a 17.3% decrease in DBC warpage, attributable to the molding cavity 112.

A third data set 1106 is calculated as a representation of warpage of a top portion of the epoxy molding compound (EMC), in units of microns (μm) within a high-power semiconductor device module 100 that is not equipped with the molding cavity 112. The EMC warpage occurs during the sintering operation 506 at room temperature (25 degrees C.). A fourth data set 1108 is calculated as a representation of EMC warpage within a high-power semiconductor device module 100 that is equipped with the molding cavity 112. Improvement indicated by the second simulation data plot in FIG. 11 shows a 22.0% decrease in EMC warpage, attributable to the molding cavity 112.

A fifth data set 1110 is calculated as a representation of warpage of a DBC structure, in units of microns (μm) within a high-power semiconductor device module 100 that is not equipped with the molding cavity 112. The DBC warpage occurs during the sintering operation 506 at high temperature (220 degrees C.). A sixth data set 1112 is calculated as a representation of DBC warpage within a high-power semiconductor device module 100 that is equipped with the molding cavity 112. Improvement indicated by the third simulation data plot in FIG. 11 shows a 56.2% decrease in DBC warpage, attributable to the molding cavity 112.

A seventh data set 1114 is calculated as a representation of warpage of a top portion of the epoxy molding compound (EMC), in units of microns (μm) within a high-power semiconductor device module 100 that is not equipped with the molding cavity 112. The EMC warpage occurs during the sintering operation 506 at high temperature (220 degrees C.). An eighth data set 1116 is calculated as a representation of EMC warpage within a high-power semiconductor device module 100 that is equipped with the molding cavity 112. Improvement indicated by the fourth simulation data plot in FIG. 11 shows a 46.4% decrease in EMC warpage, attributable to the molding cavity 112. In conclusion, the high temperature data at 220 degrees C. shows an even more dramatic improvement than the room temperature data, in both DBC warpage and EMC top warpage when the molded package 110 includes a molding cavity 112.

As described above, various implementations of a high-power semiconductor device module 100 in which a molding package 110 is formed with a central molding cavity 112 can relieve stress on a semiconductor die contained therein, thus protecting the die while sintering the molding package 110 to a heat sink. Such protection can be important in meeting automotive requirements when the semiconductor die is a component in a power inverter circuit for an electric vehicle or a hybrid electric vehicle.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:

a substrate;

a chip assembly coupled to the substrate, the chip assembly including a semiconductor die;

a sense pad attached to the substrate and electrically coupled to the chip assembly;

a molding package formed around the chip assembly and the substrate, the molding package having a cavity including a gel material, wherein the molding package is disposed on a first portion of an upper surface of the sense pad and the gel material is disposed on a second portion of the upper surface of the sense pad;

a mounting bracket attached to the substrate; and a lead that provides a signal path from an external device to the semiconductor die.

2. The apparatus of claim 1, wherein the semiconductor die includes a power inverter circuit.

3. The apparatus of claim 2, wherein the power inverter circuit is configured for use in one or more of an electric vehicle and a hybrid electric vehicle.

4. The apparatus of claim 1, wherein the gel material includes one or more of JCR6101 and HD-8820.

5. The apparatus of claim 1, wherein the sense pad is configured to sense an environmental condition including at least one of temperature or pressure transmitted through the gel material.

6. The apparatus of claim 1, further comprising a first wire bond between the semiconductor die and the sense pad and a second wire bond between the sense pad and the lead, the first wire bond being encapsulated in the gel material, the second wire bond being encapsulated in the molding package.

7. The apparatus of claim 1, further comprising a clip within the cavity, the clip providing connections to the semiconductor die.

8. An apparatus, comprising:

a substrate;

a power inverter circuit coupled to the substrate;

a sense pad attached to the substrate and electrically coupled to the power inverter circuit; and a molding package formed around the power inverter circuit and the substrate, the molding package having a cavity formed therein, wherein the cavity is filled with a gel material, and wherein the molding package is disposed on a first portion of an upper surface of the sense pad and the gel material is disposed on a second portion of the upper surface of the sense pad.

9. The apparatus of claim 1, wherein a first end of the sense pad is encapsulated only in the molding package and a second end of the sense pad is encapsulated only in the gel material.

10. The apparatus of claim 8, wherein the power inverter circuit is in a flip chip configuration.

11. The apparatus of claim 8, wherein the cavity has a volume that is about 15% of a volume of the molding package.

12. The apparatus of claim 8, further comprising a direct-bonded metal (DBM) structure that provides single sided cooling for the power inverter circuit.

13. The apparatus of claim 8, wherein the package exhibits warpage less than about 30 μm.

14. A method, comprising:

attaching a chip assembly, including a semiconductor die, to a substrate;

attaching a clip between the chip assembly and the substrate;

attaching a wire bond between the chip assembly and a sense pad on the substrate;

forming a molded package around the substrate to form a module, the molded package including a cavity that exposes the chip assembly, the clip, and a first portion of an upper surface of the sense pad, the molded package being disposed on a second portion of the upper surface of the sense pad;

sintering the module to a base; and disposing a gel material in the cavity after sintering the module to the base, wherein the gel material is disposed on the first portion of the upper surface of the sense pad.

15. The method of claim 14, wherein sintering the module to the base subjects the semiconductor die to a tensile stress of more than about 200 MPa.

16. The method of claim 14, wherein sintering the module with the cavity unfilled reduces a stress on the semiconductor die by more than about 60% during sintering.

17. The method of claim 14, wherein including the cavity in the molded package reduces warpage of the molded package by more than about 15% during sintering at a temperature of about 25 degrees C.

18. The method of claim 14, wherein including the cavity in the molded package reduces warpage of the molded package by more than about 45% during sintering at a temperature of about 220 degrees C.

19. The method of claim 14, wherein forming the molded package around the substrate includes forming the molded package by injection molding of an epoxy molding compound.

20. The method of claim 14, wherein sintering the molded package to the base includes sintering the molded package to a heat sink.

* * * * *